United States Patent [19]

Hayashi et al.

[11] Patent Number: 5,325,049

[45] Date of Patent: Jun. 28, 1994

[54] FREQUENCY DEVIATION MEASURING APPARATUS

[75] Inventors: Mishio Hayashi, Saitama; Kazuyoshi Chinoda, Fukaya, both of Japan

[73] Assignee: Advantest Corporation, Tokyo, Japan

[21] Appl. No.: 35,594

[22] Filed: Mar. 23, 1993

[30] Foreign Application Priority Data

Mar. 25, 1992 [JP] Japan .................................. 4-066936

[51] Int. Cl.$^5$ ........................................... G01R 23/02
[52] U.S. Cl. .............................. 324/76.41; 324/161;
324/76.47; 328/134; 307/526; 340/658
[58] Field of Search .................... 377/39; 340/658;
324/76.41, 161, 76.47, 76.48; 388/909, 912;
307/525, 526; 328/134

[56] References Cited

U.S. PATENT DOCUMENTS

| | | | |
|---|---|---|---|
| 3,990,007 | 11/1976 | Hohhof. | |
| 4,236,110 | 11/1980 | Shearer | 324/76.41 |
| 4,709,224 | 11/1987 | Fiori | 324/76.41 |
| 4,769,798 | 9/1988 | Hayashi | 368/121 |

FOREIGN PATENT DOCUMENTS 0277638 8/1988 European Pat. Off. .
2353473 4/1975 Fed. Rep. of Germany .

OTHER PUBLICATIONS

"Phase Difference or Relative Frequency Deviation Measuring Instrument," K. Nishikawa, Patent Abstracts of Japan, vol. 13, No. 342 (P-908), Apr. 19, 1989.

Primary Examiner—Kenneth A. Wieder
Assistant Examiner—Jose M. Solis
Attorney, Agent, or Firm—Staas & Halsey

[57] ABSTRACT

Based on a desired center frequency and a frequency resolution for a signal to be measured which are entered via an operator section, a micro-CPU calculates the frequency dividing number, a preset value and a center value for the signal to be measured. The frequency dividing number is set in a frequency divider, which frequency divides the signal to be measured and provides the frequency-divided output to a continuous period-to-voltage converter. The continuous period-to-voltage converter counts clock pulses occurring in each frequency-divided period, measures the difference between fractions of time from both the beginning and the end of the frequency-divided period to the generation of the next clock pulses, respectively, and outputs, as a voltage corresponding to the frequency-divided period, the sum of a voltage corresponding to a predetermined number of consecutive low-order bits of a binary value, obtained by adding the preset value to the pulse count value, and the fractional time difference. A subtractor is supplied with a voltage corresponding to the frequency-divided period and a voltage corresponding to the center value and outputs the voltage difference as a frequency-divided period deviation, and the micro-CPU calculates a frequency deviation of the measured signal from the center frequency on the basis of the frequency-divided period deviation.

6 Claims, 2 Drawing Sheets

FREQUENCY DEVIATION MEASURING APPARATUS

BACKGROUND OF THE INVENTION

The present invention relates to a frequency deviation measuring apparatus and, more particularly, to a frequency deviation measuring apparatus whereby the deviation between a preset frequency (hereinafter referred to as a center frequency) and a measured frequency is displayed with a preset resolution.

For evaluating the revolution performance of a motor which drives a rotary member used in a video tape recorder (VTR), a compact disk player (CD), a digital audio tape recorder (DAT), or similar electronic equipment, there has been proposed an effective method according to which an output obtained by superimposing an external disturbance on the output of an oscillator which drives the motor is used to drive the motor and a variation in the frequency generator output proportional to the rotating speed of the motor is measured by means of, for example, a delta F ($\Delta F$) measuring apparatus.

Yet the delta F measuring apparatus is not commercially available and its measured data lacks objectivity unless its rating is defined.

SUMMARY OF THE INVENTION

It is therefore an object of the present invention to provide a high-resolution delta F measuring apparatus which is free from the above-mentioned problem and can be used for general purposes.

The frequency deviation measuring apparatus according to the present invention includes:

operation means for entering a desired center frequency and a frequency resolution with respect to a signal to be measured;

calculation control means for calculating a frequency dividing number, a preset value and a center value with respect to the signal to be measured, on the basis of the center frequency and the resolution provided from the operation means;

clock generating means for generating clock pulses of a predetermined period;

frequency dividing means having set therein the frequency dividing number, for frequency dividing and outputting the signal to be measured;

continuous period-to-voltage converting means which is supplied with the frequency divided output, counts the clock pulses in each period, measures the difference between fractions of time from both ends of the frequency divided period to the next clock pulse, and outputs, as a voltage corresponding to the frequency divided period, the sum of a voltage corresponding to a plurality of predetermined consecutive low-order bits of a binary value obtained by adding the preset value to the pulse count value and the fractional time difference; and deviation calculating means which is supplied with the voltage corresponding to the frequency divided period and a voltage corresponding to the center value and outputs the difference between the voltages as a period deviation.

DESCRIPTION OF THE PREFERRED EMBODIMENT

Figure 1:
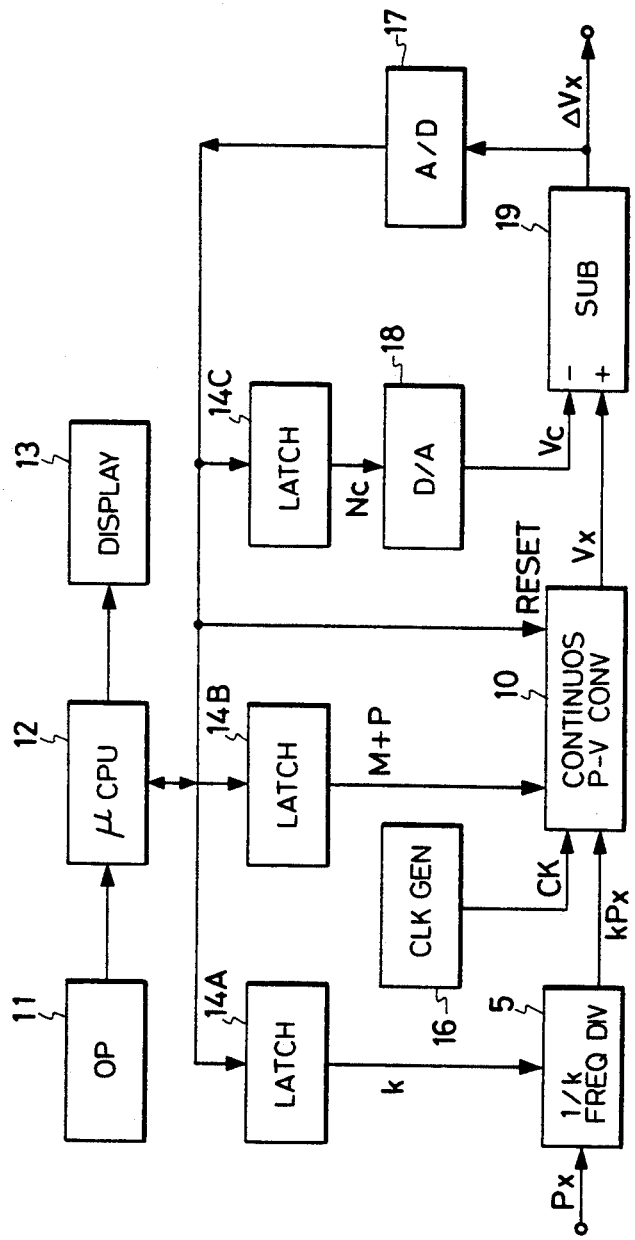
FIG. 1 is a block diagram of a frequency deviation measuring apparatus according to the present invention.

Referring first to FIG. 1, an embodiment of the present invention will be described.

Reference numeral 11 denotes an operation part, which enters a center frequency Fc and a resolution $\Delta F$ into an apparatus. On the basis of these values input through the operation part 11, a micro CPU 12 calculates a frequency dividing number k (where k is an integer equal to or greater than 1), a preset value M+P (where M and P are integers equal to or greater than 0) and a center value Nc (where Nc is an integer equal to or greater than 0), and these values are latched in latches 14A, 14B and 14C and, at the same time, they are displayed on a display 13. A 1/k frequency divider 15, set to the frequency dividing number k, frequency-divides a signal of a cycle period Px (frequency Fx=1/Px), that is to be measured, down to 1/k and the frequency-divided output of a period kPx is applied to a continuous period-to-voltage converter (hereinafter referred to as a continuous P-V converter) 10. Reference numeral 16 denotes a clock generator and 18 a digital-to-analog converter (hereinafter referred to as a D-A converter) for converting the above-mentioned center value Nc to a center voltage Vc. A difference voltage between a voltage signal Vx corresponding to the cycle period Px of the signal to be measured, available from the continuous P-V converter 10, and a center voltage Vc corresponding to the period of the pre-entered center frequency Fc is obtained as a period deviation voltage output $\Delta Vx$ by means of a subtractor 19. That is, according to the present invention, the deviation of the actually measured frequency from the center frequency Fc is obtained on the assumption that the center frequency Fc as an expected frequency (or design frequency, or a frequency which is a required specification) of the signal to be measured is preknown.

Figure 2:
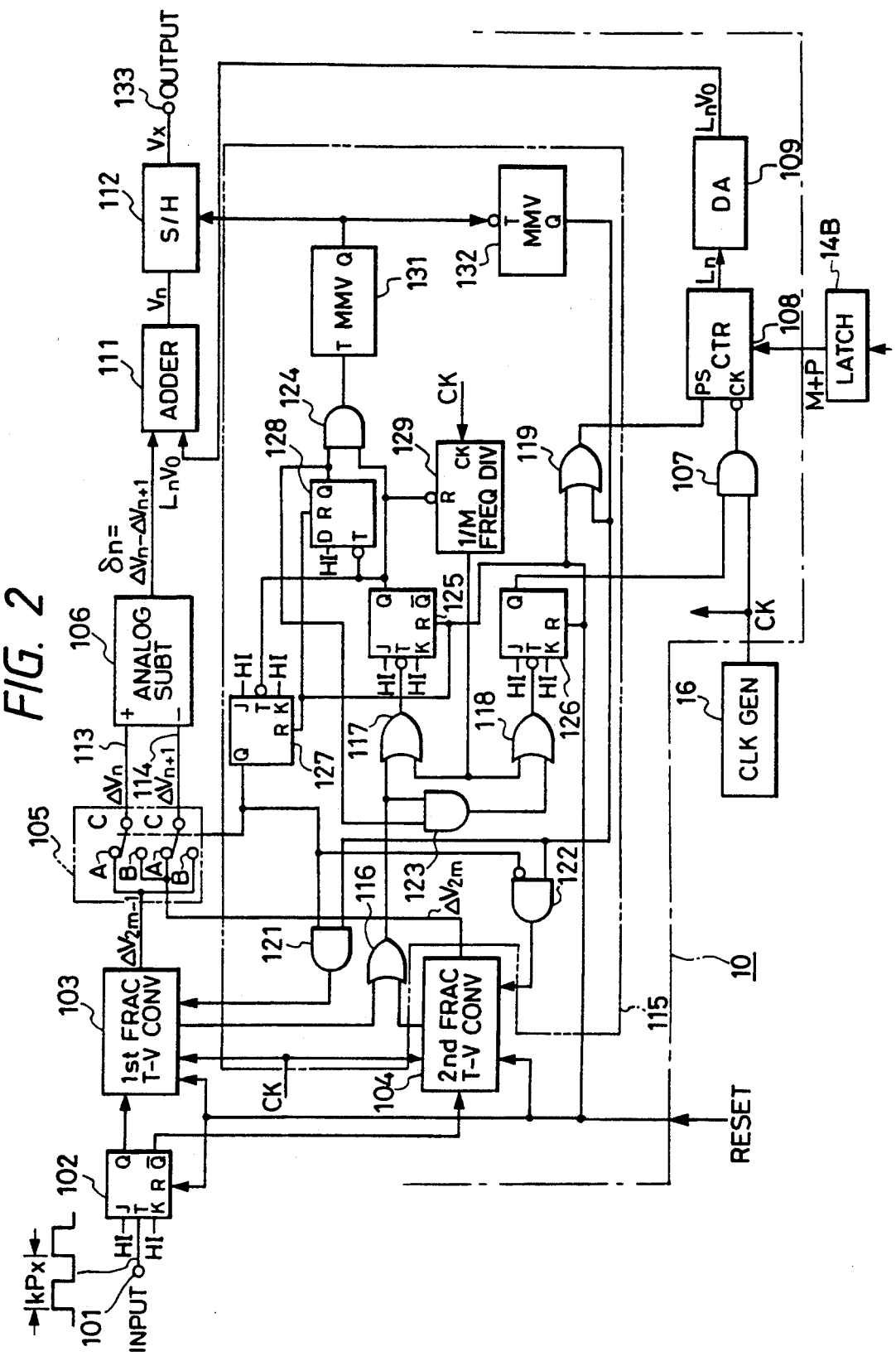
FIG. 2 is a block diagram of a continuous period-to-voltage converter for use in the present invention.

The continuous P-V converter 10 has such a construction as shown in FIG. 2, which is substantially identical with the construction disclosed in U.S. Pat. No. 4,769,798 but the latch 14B and the clock generator 16 are included in the continuous P-V converter in the U.S. patent. As described later in detail, the value to be set in the latch 14B and its meaning according to the present invention are not the same as in the U.S. patent. Moreover, in the present invention only a predetermined number of low-order bits of the count value of a presettable counter 108 are provided to a D-A converter 109, whereas in the U.S. patent all bits of the count value of the presettable counter 108 are provided to the D-A converter 109. Despite these differences the principle of fundamental operation for period measurements by the converter depicted in FIG. 2 is the same as the principle of operation in the U.S. patent, and hence no detailed description will be given of its operation but a brief description will be made of the function of its respective part.

The leading edge of an input frequency-divided pulse, which is applied to an input terminal 101, is detected by a signal detector 102. In response to the detection outputs Q and $\overline{Q}$ of mutually opposite logic from the signal detector 102, first and second fractional time-to-voltage converters (hereinafter referred to as fractional T-V converters) 103 and 104 start integration alternately with each other and upon arrival of a predetermined number of clock pulses after the start of their integration, they stop integration and alternately convert fractional times $\Delta T_{2m-1}$ and $\Delta T_{2m}$ from the detection of an input pulse (its rise, for instance) to the generation of a predetermined equal number of clock pulses, into voltage signals $\Delta V_{2m-1}$ and $\Delta V_{2m}$. The suffixes $2m-1$ and $2m$, . . . indicate the numbers of the input frequency-divided pulses, and $m = 1, 2, \ldots$. The voltage signals $\Delta V_{2m-1}$ and $\Delta V_{2m}$, which are output from the fractional T-V converters 103 and 104 alternately with each other, are provided onto signal lines 113 and 114 via a change-over switch 105. In this case, the voltage signals $\Delta V_{2m-1}$ and $\Delta V_{2m}$ are provided as a voltage signal $\Delta V_n$ on the signal line 113 and as a voltage signal $\Delta V_{n+1}$ on the signal line 114 in the order in which they are updated. The suffix n represents the number of the measurement period and is $1, 2, \ldots$.

An analog subtractor 106 subtracts the voltage signal $\Delta V_{n+1}$ from the voltage signal $\Delta V_n$ to obtain a difference voltage signal $\delta_n$. A gate 107 extracts clock pulses which are present in the period of the input frequency-divided pulse corresponding to each period kPx, and the thus extracted clock pulses are counted by a presettable counter 108. The count value of the counter 108 is converted by a D-A converter 109 to an analog voltage, which is provided to an adder 111 and added therein to the difference voltage signal $\delta_n$ from the analog subtractor 106. Thus a voltage Vn corresponding to the period kPx is obtained for each frequency divided period. Consequently, a series of periods of an input pulse train at the terminal 101 are sequentially converted and the converted voltages Vx are provided via a sample-hold circuit 112 to a terminal 133.

The constant M which provides the value $M+P$ to be preset in the counter 108 is to preset its value in the counter 108 so that at the end of the period kPx correct clock pulses in the period are all obtained as the count value of the counter 108, because the continuous P-V converter 10 has a construction wherein the counter 108 does not start counting the clock pulses CK simultaneously with the start of the period kPx but instead the gate 107 is enabled after counting M clock pulses CK by a frequency divider 129, as described in the afore-mentioned U.S. patent. In the present invention, however, the sum of the value M and an integral value P dependent on the center frequency Fc is preset in the counter 108 as described later in detail. Moreover, according to the present invention, at the end of each period kPx a value Ln of two lowest-order bits of the count value of the counter 108 is input into two highest-order bits of the D-A converter 109 and converted to an analog voltage LnVo. In the following description the fraction of time at the start of measurement for each frequency divided period kPx, corresponding to the voltage signal $\Delta V_n$, is identified by $\Delta T_1$ and the fraction of time at the end of measurement, corresponding to the voltage signal $\Delta V_{n+1}$, as $\Delta T_2$.

With the continuous P-V converter 10 shown in FIG. 2, by measuring the number Nx of clock pulses included in the frequency divided period kPx of the input pulse (the count value of the counter 108 when $P=0$) and the fractional times $\Delta T_1$ and $\Delta T_2$ from the start and the end of the frequency divided period kPx to the generation of predetermined numbers of clock pulses as in the U.S. patent, the frequency divided period kPx is obtained from the following expression:

$$kPx = T_0 Nx + \Delta T_1 - \Delta T_2 = T_0 Nx + \Delta t$$

where $T_0$ is the clock period. $\Delta t = \Delta T_1 - \Delta T_2$ will hereinafter be referred to as a fractional time difference. Yet what is intended to obtain with the apparatus of the present invention is the deviation of the frequency-divided period kPx from the center frequency-divided period, as a measure corresponding to the deviation of the frequency Fx of the signal to be measured from the center frequency Fc, and the deviation is very small as compared with the center frequency-divided period or the frequency-divided period to be measured (as small as several clocks, if converted into the number of clocks). To measure the deviation with a high degree of accuracy, according to the present invention, a desired amount of offset is removed from each of the frequency-divided period kPx and the center frequency-divided period with a view to make the most use of the maximum conversion range of each of the D-A converter 18 in FIG. 1 and the D-A converter 109 in FIG. 2. Even if a desired amount of offset is thus removed from each of the frequency-divided period kPx and the center frequency-divided period, the amounts of offset are cancelled each other and deviation can be measured with accuracy, because the difference between the both periods is obtained by the subtractor 19.

Next, a description will be given of conditions which are set for measurement according to the present invention.

(a) The present invention is intended to measure a frequency deviation but, basically, measures a period deviation. The reason for this is that since the frequency of the signal to be measured is as low as 100 kHz or below in many cases, it is advantageous to obtain a high resolution to measure the period deviation rather than the frequency deviation.

(b) Since it is preferable to obtain a measurement resolution of around 100 ps and continuously measure the period, the present invention employs, as the continuous P-V converter 10, for example, the continuous period-to-voltage converter disclosed in the afore-mentioned U.S. patent and shown in FIG. 2.

(c) In the continuous P-V converter 10 depicted in FIG. 2, the period $T_0$ of the clock pulse CK available from the clock generator 16 is set to 100 ns and the converted output voltage from each of the converters 103, 104 and 109, corresponding to one clock, is set to 1 V. The maximum output voltage of the D-A converter 109 is set to 4.000 V, for instance, and by providing the value Ln of the two low-order bits (i.e. digits $2^0$ and $2^1$) of the presettable counter 108 to its input of two high-order bits, the D-A converter 109 outputs any one of 0.000 V, 2.000 V and 3.000 V in accordance with the value Ln. Hence the maximum value of Ln is 3 and the output difference voltage $\delta_n$ from the analog subtractor 106, corresponding to the fractional time difference $\Delta t$ comes within the range of $\pm 1$ V. If the converted output voltage Vx available at the output terminal 133 is limited to the positive, the voltage range of the converted output voltage Vx is between 0 and $+4$ V. Converted output voltage regions of the continuous P-V converter 10, obtained by dividing the above-mentioned maximum voltage range with the voltage width corresponding to the clock period $T_0$, and the corresponding measurement time regions are such as given below in Table 1.

TABLE 1

| Output voltage | | Converted time length |
|---|---|---|
| 4.000 V | | 400.0 ns |
| | IV | |
| 3.000 V | | 300.0 ns |
| | III | |
| 2.000 V | | 200.0 ns |
| | II | |
| 1.000 V | | 100.0 ns |
| | I | |
| 0.000 V | | 000.0 ns |

Now, assuming that the period of the input signal to the continuous P-V converter 10 is $kP_x = 12.3456$ μs, the converted output voltage Vx is given by the remainder resulting from the division of the signal period by 400.0 ns corresponding to the maximum range. In this case, 100 ps which is the measurement resolution is used as the minimum unit. That is, $$123456 \div 4000 = 30, \text{ the remainder } 3456.$$

Since 345.6 ns is the remainder, the converted output voltage Vx is 3.456 V. The above division is expressed as follows:

$$3456 = 123456 \bmod 4000.$$

In general, kPx is given by the following expression as referred to above.

$$kP_x = N_x T_0 + \Delta T_1 - \Delta T_2 = N_x T_0 + \Delta t \quad (1)$$

Since kPx and $T_0$ (clock) are asynchronous with each other, $$0 \leq \Delta T_1 \leq T_0, \ 0 \leq \Delta T_2 \leq T_0 \quad (2)$$

After all, the fractional time difference, $\Delta t = \Delta T_1 - \Delta T_2$, in the case of measuring each frequency-divided period kPx with the clock period $T_0$ used as the unit therefor comes within the following range:

$$-T_0 \leq \Delta T_1 - \Delta T_2 \leq T_0 \quad (3)$$

That is, the fractional time difference ΔT may take either of positive (including zero) and negative values. For example, if the converted output voltage Vx at the output terminal 133 is 1,250 V, this voltage belongs to the region II, and as shown in Table 2 there are two kinds of combination of the value of the fractional time ΔT and the value Ln of the last two figures of the count value of the counter 108 which provides such an output voltage.

TABLE 2

| | Ln | LnV₀ | Δt | δₙ |
|---|---|---|---|---|
| Δt ≧ 0 | 1 | 1.000 V | 25.0 ns | 0.250 V |
| Δt < 0 | 2 | 2.000 V | −75.0 ns | −0.750 V |

Similarly, Table 3 shows the relationships between the sign of the fractional time t and the value Ln which provide the converted output voltage Vx belonging to each of the regions I to IV in Table 1.

TABLE 3

| Region | Δt ≧ 0 Ln | Δt < 0 Ln |
|---|---|---|
| IV | 3 | 0 |
| III | 2 | 3 |
| II | 1 | 2 |
| I | 0 | 1 |

In the case of Δt<0 in the region IV, the value Ln ought to be 4, but the value Ln is the last two-bit output of the counter 108 and hence is zero—this is an incorrect measurement. In view of this, according to the present invention, a value obtained by adding a proper value P to the constant M is preset in the counter 108 to ensure that the P-V converted output shifts out of the region IV.

That is, the latch 14B in FIG. 1 is connected to the presettable counter 108 in FIG. 2 to set its preset value P+M. The continuous P-V converter 10 is adapted so that in the case where the preset value is equal to the frequency dividing number M of the frequency divider 129 (that is, when P=0), even though the counting of clock pulses is started M clock pulses after the start of the frequency-divided period kPx, a count value just equal to the total number of clock pulses, Nx, in the frequency-divided period kPx is obtained at the end of the counting period defined by the gate 107, irrespective of the value M. Accordingly, in this instance, if a value M+1 (P=1) is preset in the presettable counter 108, the converted output voltages which appear in the regions I, II and III in Table 1 are shifted up by 1.000 V (=10.0 ns) and appear in the regions II, III and IV, respectively, and the voltage which appear in the region IV is shifted to the region I. If the preset value is M+3 (P=3), the converted output voltage in the region III appears in the region II. In this way, the converted output voltage in any region can be shifted to other regions by changing the preset value M+P.

It is possible to predict the region in which the converted output voltage in the frequency-divided period kPx when P=0, by detecting, through calculations described later on, the region to which the converted output voltage in a preknown center frequency-divided period predicted to be very close to the above period kPx would belong. In this embodiment the value M+P is chosen such that the converted output voltage would shift from the predicted region to the region II. The reason for which the region II is selected is that even if the predicted region is erroneous, the converted output voltage is very likely to be shifted to the region I or III and is not likely to be shifted to the region IV unless a frequency variation of the signal to be measured becomes abnormally larger than expected. The shift of the converted output voltage is independent of the value M and is controlled by the value P. That is, what is important is to add the value P to the total number Nx of the clock pulses in the frequency-divided period kPx, and that the value of, for example, the least significant two bits of the added value is used.

Next, a description will be given of how determine the frequency dividing number k, the preset value P+M and the center value Nc which are set in the latches 14A, 14B and 14C in the frequency deviation measuring apparatus of the present invention shown in FIG. 1. The micro-CPU 12 determines these values through the operation described below.

By actuating the operation part 11, the center frequency Fc of the signal to be measured and the required frequency resolution ΔF are entered into the micro-CPU 12. Now, suppose, for example,
Fc=1/Pc=1.234567 MHz and ΔF=1 Hz.
In the above, Pc is the center period.

Assume that the resolution for period measurement is about 100 ps. At first, the frequency dividing number k of the 1/k frequency divider (binary) is determined on the basis of the following expression:

$$\Delta F = Fc \times 100\ ps \div (kPc) \qquad (4)$$
$$= Fc \times 100\ ps/(k/Fc)$$
$$= (100\ ps/k) \times Fc^2$$

That is, $$k = (100\ ps/\Delta F) \times Fc^2 \qquad (5)$$
$$= (10^{-10} \div \Delta F) \times Fc^2$$

Substitution of numerical values of Fc and ΔF into the above gives $$k = (10^{-10}/1) \times (1.234567 \times 10^6)^2$$
$$= 152.4$$

Assuming that the frequency divider 15 is binary and that the frequency dividing number k which is actually set in the frequency divider 15 is a binary value of the minimum value of a power of 2 which is equal-to or greater than the value given by the expression (5), k=256 is selected from $$2^7 = 128 < 152.4 < 2^8 = 256.$$

At this time, the actual frequency resolution becomes around 0.6 Hz. Thus the frequency dividing number k is automatically determined by the micro-CPU 12.

Next, the preset value M+P and the center value Nc are determined. The first step for the determination of the preset value M+P is to obtain the region in which the converted output voltage will appear on the assumption that the center frequency-divided period kPc (=k/Fc) corresponding to the center frequency Fc has been converted by the continuous P-V converter 10 as described previously. That is, an integral multiple of the time (400.0 ns) corresponding to the maximum range (4.000 V) of the converted output voltage is subtracted, as an offset, from the center frequency-divided period, and a provisional center value Nc' is determined by the following division so that the remainder of the above subtraction, converted to voltage, comes within the maximum range of 4.000 V. In this case, the minimum unit for the division is 100 ps (corresponding to 1 mV) as described previously.

$$Nc' = (k/Fc) \times (1/Fc)\ \text{mod}\ 400.0\ ns \qquad (7)$$
$$= k/Fc\ \text{mod}\ 400.0\ ns$$

Substituting k=256 and Fc=1.234567×10⁶ into the expression (7), we have
Nc'=1601 (=1.601 V or 160.1 ns).
That is, the region to which the converted output voltage of the frequency-divided period kPx (the region to which the provisional center value Nc' belongs), which is predicted on the basis of the center frequency-divided period k/Fc in the case of P=0, is the region II in Table 1. Accordingly, since the converted output voltage need not be shifted to other regions in this case, P=0, that is, the preset value is M and the center value Nc=Nc'. Table 4 shows the relationship between the regions to which the provisional center value Nc' belongs and the corresponding preset value M+P to be selected.

TABLE 4

| Region | Nc' | M + P | Range of Center Value |
|---|---|---|---|
| IV | 3000~3999 | M + 2 | 1000~1999 |
| III | 2000~2999 | M + 3 | 1000~1999 |
| II | 1000~1999 | M | 1000~1999 |
| I | 0000~0999 | M + 1 | 1000~1999 |

In each case the provisional center value can be transferred to the region II in Table 1, and even in the case of the minimum deviation measuring range, it is possible to secure 100.0 ns at either of lower and upper limits, converted in time (respectively corresponding to 600 Hz in the above example).

Next, a shift amount P×1000 is added to the provisional center value Nc' so that it belongs to the region II, and the center value Nc is obtained by the following expression:

$$Nc = Nc' + P \times 1000 \qquad (8)$$

The center value Nc thus obtained is set in the latch 14C and then converted by the D-A converter 18 to the center voltage Vc, which is applied to the subtractor 19. The output range of the D-A converter 18 is +1.000 V to 1.999 V and a 1 mV resolution suffices. In the above example the center voltage Vc available from the D-A converter 18 is +1.601 V.

With the A-D converter 17 in FIG. 1, the following frequency-divided period deviation voltage is measured in digital form.

$$\Delta Vx = Vx - Vc \qquad (9)$$

Letting the frequency deviation to be ultimately obtained be represented by Δf, the following expression holds:

$$\Delta f/Fc = -\Delta Vx \times 100\ ps/kPc$$

Therefore, the frequency deviation Δf is given by the following expression:

$$\Delta f = -\Delta Vx \times 100\ ps\ Fc^2/k \qquad (10)$$
$$= -0.59537 \times \Delta Vx\ Hz$$

Figure 3:
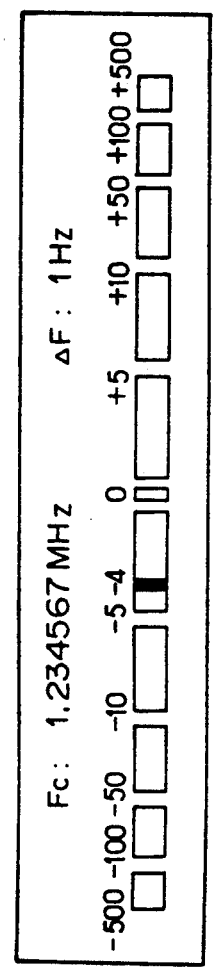
FIG. 3 is a diagram showing the display screen of a display.

The micro-CPU 12 in FIG. 1 performs the control and calculations described above. A display is provided, for example, as shown in FIG. 3, in accordance with the result of the calculation of the expression (10). The display shown in FIG. 3 is −4 Hz. Provision is made so that the range ±500 times larger than the resolution may be displayed on the display screen.

In FIG. 1 the output of the frequency deviation measuring apparatus is shown to be the period deviation voltage output. The reason for this is that it is desirable to connect external equipment, such as a general-purpose FFT analyzer, to the apparatus so as to permit a spectrum analysis of frequency variations.

Since the above embodiment has been described to employ the continuous period-to-voltage converter disclosed in U.S. Pat. No. 4,769,798, the frequency dividing number M of the frequency divider 129 is set in the counter 108 after being added to the preset value. The point is to set in the counter 108 the value that P has been added to the total number of clock pulses present in each frequency-divided period, and the principle of the present invention has nothing to do with the value of the constant M.

In the above embodiment the value Ln of the least significant two bits of the presettable counter 108 is provided as the input of the most significant two bits of the D-A converter 109 to select any one of 0 V, 1 V, 2 V and 3 V as the output of the D-A converter 109 and, in the case of P=0, the output Vn of the adder 111 (and consequently the converted output voltage Vx) comes into any one of the regions 0 to 1 V, 1 to 2 V, 2 to 3 V and 3 to 4 V, accordingly. In this instance, however, the value Ln need not be limited specifically to the value of the least significant two bits but may also be a value of three or more bits. In general, in the case where the least significant W bits (where W is an integer equal to or greater than 2) is provided as the input of the most significant W bits of the D-A converter 109, the D-A converter selectively outputs, in accordance with the value Ln, any one of $2^W$ voltages into which a voltage range from 0 V to the maximum output voltage of the D-A converter is divided with equally spaced-apart steps. In this case, the conversion coefficients of the fractional T-V converters 103 and 104 are determined so that the converted output voltage of the continuous P-V converter 10, corresponding to the clock pulse period $T_0$, may be equal to the step width.

While the measurement of a frequency deviation has been described, a period deviation can also be measured by exactly the same procedure as described above (in which case the calculations involved are simpler than in the above).

As described above, according to the present invention, the frequency deviation can be measured with a high resolution only by setting the minimum amount of information such as the center frequency and resolution.

Moreover, the frequency deviation measuring apparatus of the present invention is general-purpose but simple in construction, and hence is inexpensive. Thus the present invention greatly contributes to the development in the technical fields to which the frequency deviation measuring apparatus of this kind belongs.

It will be apparent that many modifications and variations may be effected without departing from the scope of the novel concepts of the present invention.

What is claimed is:

1. A frequency deviation measuring apparatus comprising:
   operation means for entering a desired center frequency and a frequency resolution for a signal to be measured;
   calculation control means for calculating the frequency dividing number, a preset value and a center value for said signal to be measured, on the basis of said center frequency and said resolution, provided from said operation means;
   clock generating means for generating clock pulses of a predetermined period;
   frequency dividing means which has set therein said frequency dividing number, frequency divides said signal to be measured and provides the frequency-divided output;
   continuous period-to-voltage converting means which is supplied with said frequency-divided output and outputs a voltage corresponding to each of a series of frequency-divided periods, said continuous period-to-voltage converting means including clock counting means which has preset therein said preset value and counts said clock pulses in said each frequency division period, fractional time difference measuring means which measures the difference between fractional times from the beginning and end of said each frequency-divided period to the respective points of time of the completion of generation of a predetermined number of said clock pulses thereafter and outputs the measured difference as a fractional time difference voltage, D-A converter means which is supplied with a predetermined number of consecutive low-order bits of said pulse count value and converts them into the corresponding voltage, and adder means for outputting the sum of said fractional time difference voltage and said output voltage of said D-A converter means as a voltage corresponding to said frequency divided period; and
   subtractor means which is supplied with said voltage corresponding to said frequency-divided period and a voltage corresponding to said center value and outputs their difference as a frequency-divided period deviation.

2. The apparatus of claim 1 which further comprises A-D converter means for converting said frequency-divided period deviation from said subtractor means into a digital value and in which said calculation control means includes means whereby a frequency deviation of said signal to be measured from said center frequency is calculated from said frequency-divided period deviation provided as said digital value.

3. The apparatus of claim 2 which further comprises display means for displaying said calculated frequency deviation.

4. The apparatus of claim 1 wherein said calculation control means includes means for determining said preset value, depending on which region of a predetermined maximum range of said converted output voltage the remainder of a division of said center frequency by a time corresponding to said predetermined maximum range of said converted output voltage belongs to.

5. The apparatus of claim 4 wherein said plurality of low-order bits are the last two bits.

6. The apparatus of claim 5 wherein said preset value is selected so that said center value enters into said region which is the second lowest.

* * * * *